United States Patent [19]

Kurosawa

[11] Patent Number: 4,866,494

[45] Date of Patent: Sep. 12, 1989

[54] SEMICONDUCTOR MEMORY DEVICE HAVING A PLURALITY OF MEMORY CELLS OF SINGLE TRANSISTOR TYPE

[75] Inventor: Susumu Kurosawa, Tokyo, Japan

[73] Assignee: NEC Corporation, Tokyo, Japan

[21] Appl. No.: 105,373

[22] Filed: Oct. 7, 1987

[30] Foreign Application Priority Data

Oct. 7, 1986 [JP] Japan .................. 61-239722

[51] Int. Cl.$^4$ ............. H01L 29/78; H01L 29/06; H01L 27/02

[52] U.S. Cl. ..................... 357/23.6; 357/55; 357/41

[58] Field of Search .............. 357/23.6, 55, 41

[56] References Cited

U.S. PATENT DOCUMENTS 4,672,410 6/1987 Miura et al. ............. 357/23.6

FOREIGN PATENT DOCUMENTS 2184290 6/1987 United Kingdom ........... 357/23.6

OTHER PUBLICATIONS

"High Density Vertical DRAM Cell", IBM Technical Disclosure Bulletin, vol. 29, No. 5, Oct. 1986, pp. 2335-2340.

Primary Examiner—Rolf Hille
Assistant Examiner—Robert P. Limanek
Attorney, Agent, or Firm—Sughrue, Mion, Zinn, Macpeak & Seas

[57] ABSTRACT

A new memory device of single transistor type is disclosed. A substrate has a surface portion of low impurity concentration and an inner portion of high impurity concentration, and a trench is formed in the substrate from the surface portion into the inner portion such that the trench surrounds a cell section of the substrate. A switching transistor is formed in the surface portion at the cell section, and a capacitor is formed in the trench such that a MOS type capacitor is constituted by a capacitor electrode, the lower side wall by the inner portion of the substrate and an insulating film therebetween. A bit line is connected to a conductive layer provided at the upper part of the trench, and the conductive layer is connected to the source or drain region of the transistor.

5 Claims, 4 Drawing Sheets

SEMICONDUCTOR MEMORY DEVICE HAVING A PLURALITY OF MEMORY CELLS OF SINGLE TRANSISTOR TYPE

BACKGROUND OF THE INVENTION

The present invention relates to a semiconductor memory device having a plurality of memory cells of single transistor type, and more particularly to a memory cell having a trench capacitor.

A new single transistor type memory cell constituted by one transistor and one storage capacitor was proposed in TECHNICAL DIGEST OF IEDM, 1984, pp 240 to 243, by S. Nakajima et al. entitled "AN ISOLATION-MERGED VERTICAL CAPACITOR CELL FOR LARGE CAPACITY DRAM". In the memory cell, a trench for forming the capacitor is provided in a semiconductor substrate having a uniform impurity concentration from the major surface into the inner portion thereof, and surrounds the transistor forming region of the substrate. A cell plate is provided in the trench and capacitor electrodes are provided between the side walls of the trench and the cell plate, respectively, such that a first MOS capacitor is formed between the side wall of the trench and the capacitor electrode, and a second MOS capacitor is formed between the capacitor electrode and the cell plate. Source and drain regions of the transistor are formed in the transistor forming region surrounded by the trench. One of the source and drain regions is connected to the capacitor electrode at an upper side portion of the trench and the other of the source and drain regions is connected to a bit line at a surface portion located within the surface of the transistor forming region and separated from the trench.

The memory cell can realize a large amount of storage capacitance because the first and second MOS capacitors surround the transistor forming region. The cell plate, to which a constant voltage such as ground potential is applied, surrounds each memory cell. Therefore, an interference between memory cells can be avoided even if a conventional thick field insulating layer would not be formed therebetween.

However, in the memory cell, the bit line is connected to the source or drain region of the transistor at the portion which is located within the surface of the transistor forming region and separated from the trench. Therefore, a miniaturization of the memory cell in more extent, that is, a higher integration of the memory device cannot be realized. Further, the impurity concentration of the substrate cannot be a high level because of obtaining a necessary breakdown voltage of the PN junction between the source, drain regions and the substrate. In this case, an inversion layer are apt to produce along the side wall of the trench when a high voltage is applied to the capacitor electrode. Consequently, the information reservation characteristic of the memory cell is deteriorated by a leakage current between the inversion layer and the bit line via the source or drain region to which the bit line is connected.

SUMMARY OF THE INVENTION:

Accordingly, it is an object of the present invention to provide an effective memory device in which the integration can be enhanced and the information reservation characteristic is never deteriorated by the leakage current.

According to one feature of the present invention, there is provided a semiconductor memory device having a plurality of memory cells which comprises a semiconductor substrate including a semiconductor body of one conductivity type and a semiconductor layer of one conductivity type having a lower impurity concentration than that of the semiconductor body and formed on the semiconductor body, a plurality of cell sections of the substrate, each of the cell sections having a rectangular shape in the plan view, a trench formed in the substate from the surface of the semiconductor layer into the semiconductor body through the semiconductor layer and surrounding each of the cell sections such that the trench delineates the rectangular shape in the plan view of the cell section and that the side walls of the trench are constituted by lower side walls of the semiconductor body and upper side walls of the semiconductor layer, first insulating films formed on the lower side walls of the trench such that the first insulating film surround respective the rectangular shape cell sections, capacitor electrodes formed on the first insulating films, respectively, such that the capacitor electrodes surround respective the rectangular shape cell sections, each of the capacitor electrodes being provided above both of the lower and upper side walls at one side of the rectangular shape cell section and provided only above the lower side wall such that it is free from above the upper side wall at another side of the rectangular shape cell section, second insulating films provided on the capacitor electrodes, a common cell plate provided on the second insulating films such that the common cell plate is faced to respective the capacitor electrodes via the second insulating films, source and train regions of the opposite conductivity type formed in the semiconductor layer of said cell sections, one of the source and drain regions being provided along the one sides of the cell sections and connected to the capacitor electrodes and the other of source and drain regions being provided along the other sides of the cell sections, conductive layers provided at the upper parts of the trench along the another sides of the cell sections and connected to the other of source and drain regions, and a bit line connected to the conductive layers. To avoid the occurrence of the inversion layer along the trench, the impurity concentration of the semiconductor body is favorably $1 \times 10^{18}$ atoms/cm$^3$ or more, and to obtain a sufficient breakdown voltage of source and drain regions of the transistor with a practical view, the semiconductor layer has favorably the impurity concentration ranging from $1 \times 10^{15}$ atoms/cm$^3$ to $5 \times 10^{17}$ atoms/cm$^3$ and the thickness ranging from 1 $\mu$m to 3 $\mu$m.

Figure 1A:
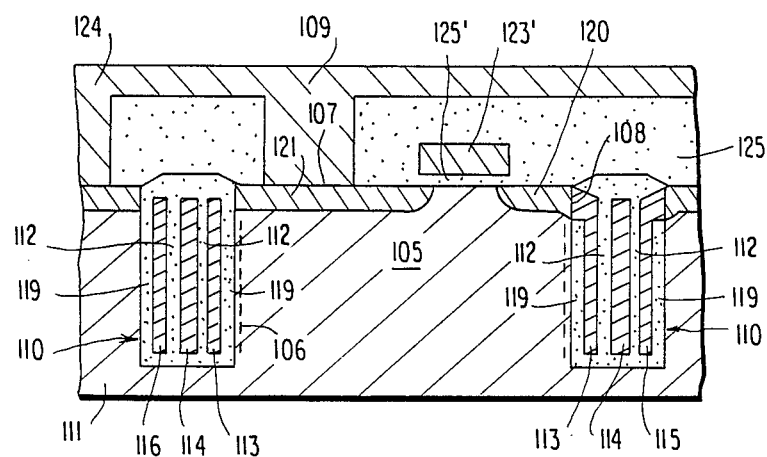
FIGS. 1A and 1B are cross-sectional views showing a semiconductor memory device in a prior art taken along the bit line and the word line, respectively.
Figure 1B:
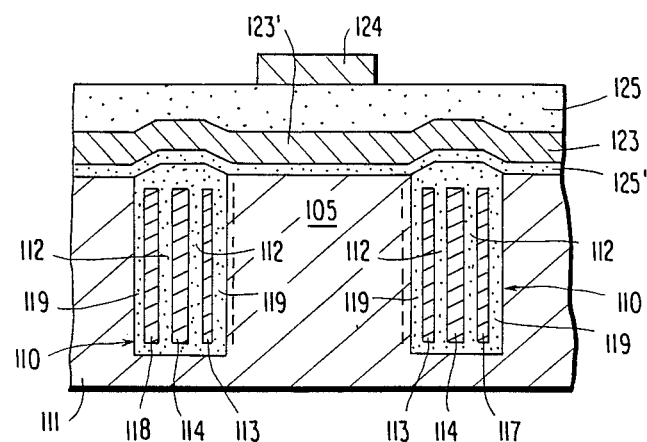

DESCRIPTION OF THE PRIOR ART:

Referring to FIGS. 1A and 1B, a trench 110 is formed in a P-type substrate 111 having an uniform impurity concentration from the upper surface of the substrate to the inner portion thereof and surrounds a cell section 105 of the substrate in which a switching transistor is provided.

In the trench 110, a capacitor electrode 113 is formed on the side wall via a first insulating film 119 such that a first MOS capacitor is constituted by the substrate, that is, the side wall, the first insulating film and the capacitor electrode. Further, a common cell plate 114, to which a constant voltage such as earth potential is applied, is provided on the capacitor electrode via a second insulating film 112 to form a second MOS capacitor. The storage capacitor of the memory cell consist of the first and second MOS capacitors. Capacitor electrodes 115, 116, 117 and 118 of adjacent memory cells are provided in the same manner as the capacitor electrode 113, and the cell plate 114 is also employed as a common electrode for the adjacent memory cells. A pair of N-type impurity regions 120, 121 are formed in the upper surface of the substrate, and one of them is used as a source region of a transistor of the memory cell and the other is used as a drain region of the transistor. On the channel region between the impurity regions 120, 121, a gate electrode 123' which may be a part of a word line 123 is formed via a gate insulating film 125'. The N-type impurity region 120 is connected to the capacitor electrode 113 at an upper side part 108 of the trench, and a bit line 124 is connected to the N-type impurity region 121 through a contact hole 109 provided in an insulating layer 125 at a contact portion 107 of, for example, 1.2 $\mu m \times 1.2$ $\mu m$ which is located in the surface of the cell region 105 and separated from the trench 110. In the structure shown in FIG. 1, an inversion layer (N type layer) 106 is apt to produce along the side wall of the trench when a high positive voltage of +5 volt, for example, is applied to the capacitor electrode 113, and therefore, an information stored in the capacitor flows unfavorably to the bit line through the N-type impurity region 121. Further, the whole area of the contact portion 107 is provided on the N-type impurity region 121. Therefore, a high interagated density of the device cannot be expected.

DESCRIPTION OF THE EMBODIMENTS:

(First Embodiment)

Figure 2:
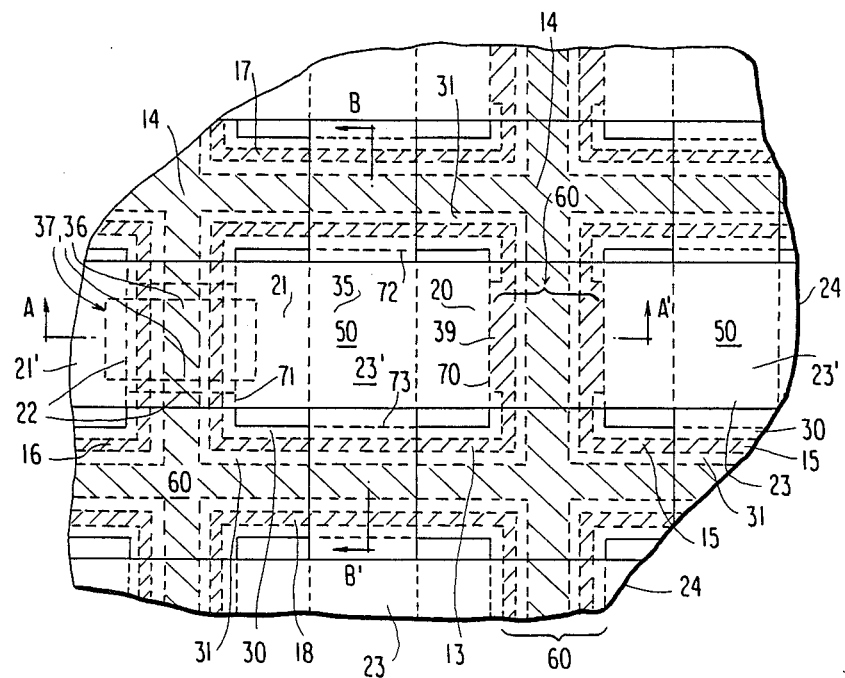
FIG. 2 is a plan view showing a first embodiment of the present invention.
Figure 3A:
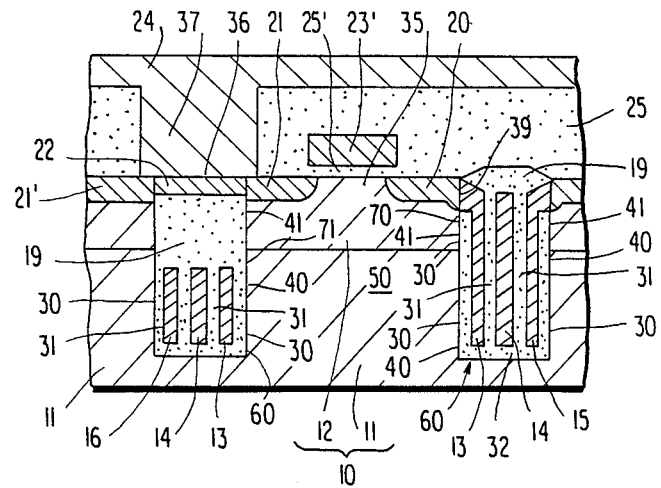
FIGS. 3A and 3B are cross-sectional views of the first embodiment taken along lines A—A' and B—B', respectively, in FIG. 2 as viewed in the directions of arrows.
Figure 3B:
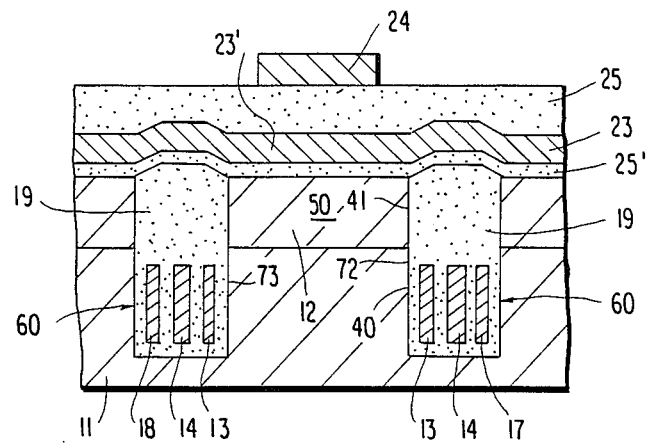

Referring to FIG. 2 and FIGS. 3A, 3B, a P-type semiconductor substrate 10 is composed by a P-type silicon body 11 having the impurity concentration of $1 \times 10^{19}$ atoms/cm$^3$ and a P-type epitaxial silicon layer 12 having the impurity concentration of $1 \times 10^{17}$ atoms/cm$^3$ formed on the silicon body, and a trench 60 having the width of 1.0 $\mu m$ and the depth of 5.0 $\mu m$ is formed in the substrate 10 from the upper surface of the silicon layer 12 into the silicon body 11. The trench 60 has a grid like shape in the plan view (FIG. 2) such that it surrounds each of cell sections 50 of the substrate. More particularly, the cell section 50 has a rectangular plan shape of 2.0 $\mu m \times 1.5$ $\mu m$, for example, surrounded by four straight edges 70, 71, 72, 73 which are delineated by the trench 60. An insulating film 32 is provided on the bottom of the trench, and a first insulating films 30 made of thermal silicon oxide and having the thickness of 5 nm to 30 nm are formed on lower side walls 40 of the trench 60 at the silicon body 11 such that each of the first insulating films 30 surrounds each of the cell sections 50 at the silicon body portion. The first insulating film 30 may extends on an upper side wall 41 at the side 70 as shown in FIG. 3A. Capacitor electrode 13 of N-type polycrystalline silicon is formed on the first insulating film 30 and surrounds the cell section 60 at the silicon body portion, and only at the side 70 of the capacitor electrode 13 extends upwardly. A first MOS capacitor is constituted by the side wall 40 of the trench 60 at the silicon body 11 to which earth potential or −2 volt is applied, the first insulating film 30 and the capacitor electrode 13. Capacitor electrodes 15, 16, 17, 18 for forming MOS capacitors of the adjacent memory cells are formed by the same manner as the capacitor electrode 13. Second insulating films 31 made of thermal silicon oxide and having the thickness of 5 nm to 30 nm are formed on the capacitor electrodes, and a common cell plate 14 made of polycrystalline silicon and having a grid-like shape in the plan view is formed on the second insulating films 31. In FIG. 2, the ring shape capacitor electrodes are represented by right-upward hatching the the grid-like shape cell plate is represented by right-downward hatching. The cell plate 14 is supplied with constant voltage such as earth potential through a wiring layer (not shown) connected to the cell plate at a peripheral portion of the substrate outside the memory section, and used as a common electrode for the plurality of memory cells. A second MOS capacitor is constituted by the cell plate 14, the second insulating film 31 and the capacitor electrode 13, 15, 16, 17 or 18, and the storage capacitor of the memory cell is composed by the first and second MOS capacitors. An insulating layer 19 such as CVD silicon oxide is continuously formed at the upper part of the trench 60. A pair of N-type impurity regions 20, 21 are formed on the upper surface of the silicon layer 12 in each cell section 50, and one is the source region of the switching transistor and the other being the drain region. The impurity region 20 is connected to the capacitor electrode 13 through an upper side part 39 of the trench at the side 70. A plurality of conductive layers 22 (only one layer is shown in Figs.) are selectively formed at the upper part of the trench along the side 71 of the cell section 50. The conductive layer 22 may be made of N-type polycrystalline silicon and connected to the N-type impurity region 21 and also to an N-type impurity region 21' of the adjacent memory cell. The bit line 24 is connected to the conductive layer 22 and edges of the impurity regions 22, 22' at a contact area 36 of 1.2 $\mu m \times 1.2$ $\mu m$ through a contact hole 37 provided in an insulating layer 25. A gate electrode 23' of the switching transistor is formed on the channel region between the impurity regions 20, 21 via a gate insulating film 25', and the gate electrode 21' may be continuously formed with the word line 23.

According to the present invention, the inversion layer of N-type is hardly produced along the lower side wall 40 because the lower side wall 40 is formed by the silicon body 11 of high impurity concentration. Further, the capacitor electrode 13 is free from above the upper side wall 41 at the sides 71, 72, 73. Therefore, even if the inversion layer would be produced along the lower side wall when a high voltage such as +5 volt is applied to the capacitor electrode, the inversion layer is cut at the upper side wall 41. Consequently, an information stored in the capacitor never flows to the bit line 24 through the N-type impurity region 21. It is to be noted that an inversion layer provided in the upper side wall 41 at the side 70 is not the question because the inversion layer is only connected to the N-type impurity region 20 which is not directly contacted to the bit line 24 but interposed the channel region therebetween. Moreover, the bit line 24 is connected to the conductive layer 22 on the trench. Therefore, the occupied area of the cell section, that is, the transistor forming area can be reduced and the integrated density of the device can be enhanced. More particularly, the area of the memory cell of the present invention can be about two third ($\frac{2}{3}$) of the prior art structure shown in FIG. 1.

(SECOND EMBODIMENT)

Figure 4A:
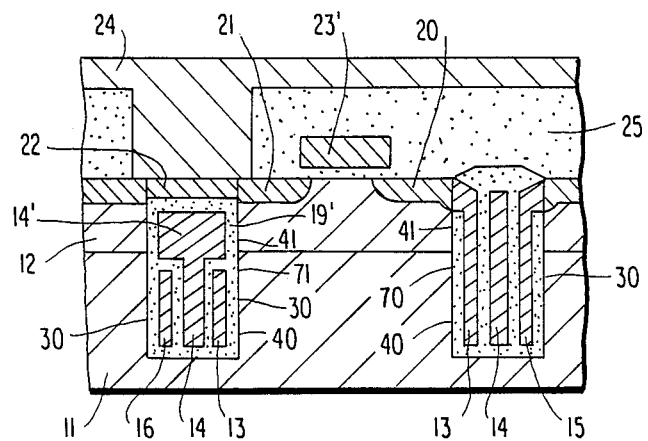
FIGS. 4A and 4B are cross-sectional views showing a second embodiment of the present invention which correspond to FIGS. 3A and 3B, respectively.
Figure 4B:
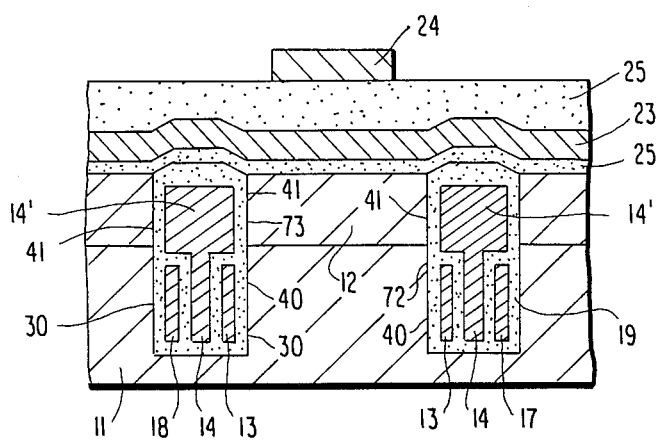

Referring to FIGS. 4A, 4B, in which same elements as those in FIG. 2 and FIGS. 3A, 3B are indicated by the same reference numerals. The difference in the embodiment from the first embodiment resides in that an enlarged part 14' is continuously provided to the cell plate 14 such that the enlarged part 14' faces to the upper side wall 41 of the silicon layer 12 at the three side 71, 72, 73 and a thin insulating film 19' whiich has nearly the same thickness as the first insulating film 30, interposed between the enlarged part 14' and the upper side wall 41. According to the embodiment, the leakage of the information from the first MOS capacitor to the bit line is more securely prevented at the side wall 41 when a low voltage such as earth potential is applied to the cell plate 14,

What is claimed is:

1. A semiconductor memory device having a plurality of memory cells comprising a semiconductor substrate including a semiconductor body of one conductivity type and a semiconductor layer of one conductivity type having a lower impurity concentration than that of said semiconductor body and formed on said semiconductor body, a plurality of cell sections of said substrate, each of said cell sections having a rectangular shape in the plan view, a trench formed in said substrate from the surface of said semiconductor layer into said semiconductor body through said semiconductor layer and surrounding each of said cell sections such that said trench delineates said rectangular shape in the plan view of said cell section and that the side walls of said trench are constituted by lower side walls of said semiconductor body and upper side walls of said semiconductor layer, first insulating films formed on said lower side walls of said trench such that said first insulating film surround respective said rectangular shape cell sections, capacitor electrodes formed on said first insulating films, respectively, such that said capacitor electrodes surround respective said rectangular shape cell sections, each of said capacitor electrodes being provided above both of said lower and upper side walls at one side of said rectangular shape cell section and provided only above said lower side wall such that it is free from above said upper side wall at another side of said rectangular shape cell section, second insulating films provided on said capacitor electrodes, a common cell plate provided on said second insulating films such that said common cell plate is faced to respective said capacitor electrodes via said second insulating films, source and drain regions of the opposite conductivity type formed in said semiconductor layer of said cell sections, one of said source and drain regions being provided along said one sides of said cell sections and connected to said capacitor electrodes and the other of source and drain regions being provided along said another sides of said cell sections, conductive layers provided at the upper parts of said trench along said another sides of said cell sections and connected to said other of source and drain regions, arid a bit line connected to said conductive layers.

2. A semiconductor memory device of claim 1, in which the impurity concentration of said semiconductor body is $1 \times 10^{18}$ atoms/cm$^3$ or more, and the impurity concentration of said semiconductor layer ranges from $5 \times 10^{17}$ atoms/cm$^3$ to $1 \times 10^{15}$ atoms/cm$^3$.

3. A semiconductor memory device of claim 1, in which the thickness of said semiconductor layer ranges from 1 $\mu$m to 3 $\mu$m.

4. A semiconductor memory device of claim 1, in which said conductive layer is made of polycrystalline silicon having the same conductivity type as that of said impurity region.

5. A semiconductor memory device having a plurality of memory cells comprising a semiconductor substrate including a surface portion of one conductivity type and an inner portion of one conductivity type having a higher impurity concentration than that of said surface portion and provided under said surface portion, a plurality of cell sections of said substrate, a trench formed in said substrate from the surface of said surface portion into said inner portion through said surface portion and surrounding each of said cell sections such a that the side walls of said trench are constituted by lower side walls of said inner portion and upper side walls of said surface portion, first insulting films formed on said lower walls of said trench such that said first insulating films surround respective said cell sections, capacitor electrodes formed on said first insulating films, respectively, such that said capacitor electrodes surround respective said cell sections, each of said capacitor electrodes being provided only above said lower side wall such a that it is free from above said upper side wall except a part of said capacitor electrode for leading-out said capacitor electrode, second insulating films provided on said capacitor electrodes, a common cell plate provided on said second insulating films such that said common cell plate is faced to respective said capacitor electrodes via said second insulating films, transistors each including source and drain regions of the opposite conductivity type formed in said surface portion of said substrate, a channel region provided at said surface of said surface portion between said source and drain regions and a gate electrode formed on said channel region via a gate insulating film, one of said source and drain regions being connected to said part of said capacitor electrode, an insulating layer covering said trench and said transistors, a contact hole formed in said insulating layer above a part of said trench, and a bit line formed on said insulating layer and electrically coupled to the other of said source and drain regions through said contact hole.

* * * * *

UNITED STATES PATENT AND TRADEMARK OFFICE
CERTIFICATE OF CORRECTION

PATENT NO. : 4,866,494

DATED : September 12, 1989

INVENTOR(S) : Kurosawa

It is certified that error appears in the above-identified patent and that said Letters Patent is hereby corrected as shown below:

Column 5, line 22, delete "whiich" and insert --which--.

Column 6, line 36, delete "insulting" and insert --insulating--.

Signed and Sealed this

Sixteenth Day of April, 1991

Attest:

HARRY F. MANBECK, JR.

Attesting Officer

Commissioner of Patents and Trademarks